(12) United States Patent
Iwao

(10) Patent No.: US 8,530,357 B2
(45) Date of Patent: Sep. 10, 2013

(54) METHOD FOR MANUFACTURING SEMICONDUCTOR DEVICE AND APPARATUS FOR MANUFACTURING SEMICONDUCTOR DEVICE

(75) Inventor: Fumiko Iwao, Nirasaki (JP)

(73) Assignee: Tokyo Electron Limited, Tokyo (JP)

( * ) Notice: Subject to any disclaimer, the term of this patent is extended or adjusted under 35 U.S.C. 154(b) by 0 days.

(21) Appl. No.: 13/521,391

(22) PCT Filed: May 6, 2011

(86) PCT No.: PCT/JP2011/002547
§ 371 (c)(1),
(2), (4) Date: Jul. 10, 2012

(87) PCT Pub. No.: WO2011/138871
PCT Pub. Date: Nov. 10, 2011

(65) Prior Publication Data
US 2012/0302066 A1    Nov. 29, 2012

(30) Foreign Application Priority Data
May 7, 2010    (JP) ................. 2010-106996

(51) Int. Cl.
H01L 21/302    (2006.01)
H01L 21/461    (2006.01)
H01L 21/311    (2006.01)
H01L 21/31    (2006.01)
H01L 21/469    (2006.01)
G03C 1/00    (2006.01)
G03F 7/00    (2006.01)

(52) U.S. Cl.
USPC ......... 438/725; 438/694; 438/780; 430/270.1

(58) Field of Classification Search
USPC ............. 438/725, 694, 780, 948; 430/270.1, 430/323, 325, 309, 301, 432, 413, 414, 311; 257/E21.06
See application file for complete search history.

(56) References Cited

U.S. PATENT DOCUMENTS

| | | | |
|---|---|---|---|
| 5,399,128 A * | 3/1995 | Nurnberger | 475/298 |
| 6,180,320 B1 * | 1/2001 | Saito et al. | 430/311 |
| 6,492,075 B1 * | 12/2002 | Templeton et al. | 430/5 |
| 6,579,657 B1 * | 6/2003 | Ishibashi et al. | 430/270.1 |
| 7,338,750 B2 * | 3/2008 | Kozawa et al. | 430/314 |
| 7,544,460 B2 * | 6/2009 | Hada et al. | 430/270.1 |
| 7,989,354 B2 * | 8/2011 | Nakajima et al. | 438/725 |
| 2006/0073419 A1 * | 4/2006 | Kozawa et al. | 430/311 |
| 2008/0008969 A1 * | 1/2008 | Zhou et al. | 430/313 |
| 2009/0311490 A1 * | 12/2009 | Burns et al. | 428/195.1 |
| 2010/0130015 A1 * | 5/2010 | Nakajima et al. | 438/703 |

FOREIGN PATENT DOCUMENTS

JP    2009-230106 A    10/2009
WO    WO2008149988    * 12/2008

* cited by examiner

*Primary Examiner* — Mary Wilczewski
*Assistant Examiner* — Erik T Peterson
(74) *Attorney, Agent, or Firm* — Nath, Goldberg & Meyer; Jerald L. Meyer

(57) ABSTRACT

A method of manufacturing a semiconductor device, which includes forming a resist layer on a substrate, performing an exposure and development process on the resist layer to form a resist pattern, performing a slimming process to slim the resist pattern, forming a mask material layer on side walls of the slimmed resist pattern, and removing the slimmed resist pattern. The slimming process further includes coating an extensive agent on the substrate, expanding the expansive agent, and removing the expanded expansive agent.

4 Claims, 11 Drawing Sheets

METHOD FOR MANUFACTURING SEMICONDUCTOR DEVICE AND APPARATUS FOR MANUFACTURING SEMICONDUCTOR DEVICE

This application is a 35 U.S.C. §371 national stage filing of International Application No. PCT/JP2011/002547, filed May 6, 2011, the entire contents of which are incorporated by reference herein, which claims priority to Japanese Patent Application No. 2010-106996, filed on May 7, 2010, the entire contents of which is incorporated by reference herein.

TECHNICAL FIELD

The present disclosure relates to a method and apparatus for manufacturing a semiconductor device.

BACKGROUND

In a conventional semiconductor device manufacturing process, fine circuit patterns have been formed by a photolithography technology using a photoresist. A side wall transfer (SWT) process or a double patterning (DP) process is under consideration as a way to further miniaturize circuit patterns.

The side wall transfer process using a photoresist as a core material requires a process of slimming only a photoresist pattern without damaging a bottom anti-reflection coating (BARC) film.

The slimming capability of the double patterning process, which utilizes a Litho-Litho-Etching (LLE) to control a line width of a resist pattern to fall within a range of 22 nm or less, may be limited by the resolution of an exposure apparatus. As such, the double patterning process requires an additional slimming process to slim down the line width of the resist pattern.

One example of such a slimming process modifies sidewalls of a resist pattern through the use of, e.g., liquid chemicals, thereby removing the sidewalls.
Patent Documents In the slimming process of modifying the sidewalls of the resist pattern with the aforementioned liquid chemicals to remove the portions of the sidewalls, an amount to be slimmed depends on optical conditions and resist species, which makes it difficult to perform a high-precision control of the slimming process. In addition, such slimming process may result in a decrease in height of the resist.

SUMMARY

The present disclosure has been made considering the above circumstances, and provides some embodiments of a method and apparatus, which are capable of precisely controlling an amount to be slimmed irrespective of optical conditions and resist species, and further preventing a decrease in height of resist, which may be caused by the slimming process.

According to one embodiment of the present disclosure, a method of manufacturing a semiconductor device includes forming a resist layer on a substrate, performing an exposure and development process on the resist layer to form a resist pattern, and performing a slimming process to slim the resist pattern, forming a mask material layer on side walls of the slimmed resist pattern, and removing the slimmed resist pattern. The slimming process includes coating an expansive agent on the substrate, expanding the expansive agent, and removing the expanded expansive agent.

According to another embodiment of the present disclosure, a method of manufacturing a semiconductor device forming a first resist layer on a substrate, performing an exposure and development process on the first resist layer to form a first resist pattern, performing a first slimming process to slim the first resist pattern, forming a second resist layer on the substrate, performing the exposure and development process on the second resist layer to form a second resist pattern, and performing a second slimming process to slim the second resist pattern. At least one of the first and second slimming processes includes coating an expansive agent on the substrate, expanding the expansive agent, and removing the expanded expansive agent.

According to yet another embodiment of the present disclosure, a method of manufacturing a semiconductor device forming a resist layer on a substrate, performing an exposure and development process on the resist layer to form a resist pattern, and performing a slimming process to slim the resist pattern. The slimming process includes coating an expansive agent on the substrate, expanding the expansive agent, and removing the expanded expansive agent.

According to still another embodiment of the present disclosure, an apparatus of manufacturing a semiconductor device to be used in slimming a resist pattern formed on a substrate, which includes a coating unit configured to coat an expansive agent on the substrate, an expanding unit configured to expand the expansive agent, and a removing unit configured to remove the expanded expansive agent.

BRIEF DESCRIPTION OF THE DRAWINGS

The accompanying drawings, which are incorporated in a constitute a part of the specification, illustrate embodiments of the present disclosure, and together with the general description given above and the detailed description of the embodiments given below, serve to explain the principles of the present disclosure.

DETAILED DESCRIPTION

Reference will now be made in detail to various embodiments, examples of which are illustrated in the accompanying drawings. In the following detailed description, numerous specific details are set forth in order to provide a thorough understanding of the inventive aspects of this disclosure. However, it will be apparent to one of ordinary skill in the art that the inventive aspects of this disclosure may be practiced without these specific details. In other instances, well-known methods, procedures, systems, and components have not been described so as not to unnecessarily obscure aspects of the various embodiments.

Figure 1A:
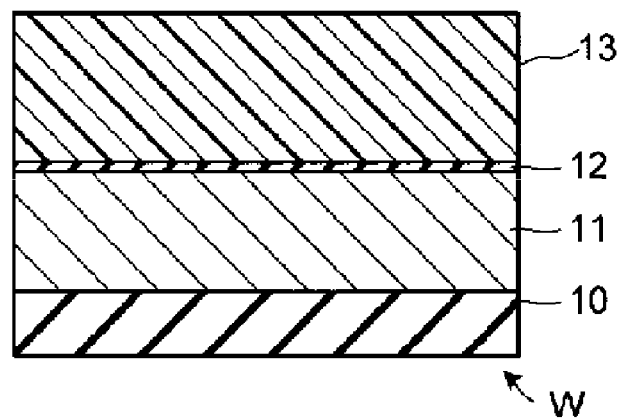
FIGS. 1A to 1F are views illustrating a semiconductor device manufacturing method according to one embodiment of the present disclosure.

FIGS. 1A to 1F illustrate a semiconductor device manufacturing method according to a first embodiment of the present disclosure, in which a part of a semiconductor wafer W is scaled up. As shown in FIG. 1A, in the one embodiment, a bottom anti-reflection coating (BARC) film 12 made of, e.g., an organic material, is formed on a polysilicon layer 11 as an etching target layer to be patterned. First, a photoresist layer 13 is formed by coating a photoresist on the bottom anti-reflection coating (BARC) film 12. In FIGS. 1A to 1F, a reference numeral 10 indicates an underlayer formed under the polysilicon layer 11.

Figure 1B:
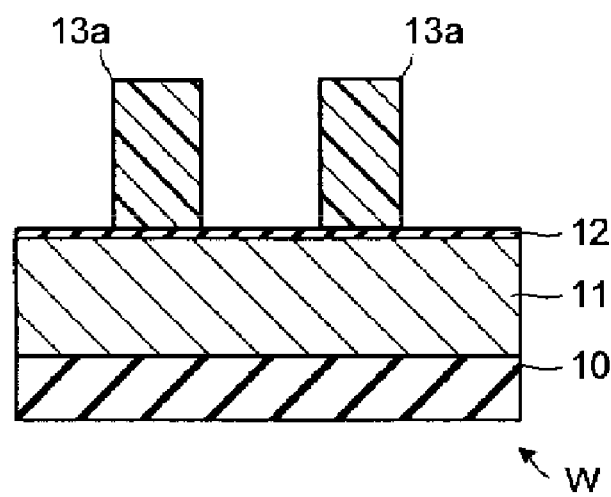

Subsequently, as shown in FIG. 1B, a photoresist pattern 13a is formed by exposing the photoresist layer 13 to light and then developing the photoresist pattern 13a to be patterned in a predetermined shape. Further, a slimming process is then performed on the photoresist pattern 13a, which will be described later.

Figure 1C:
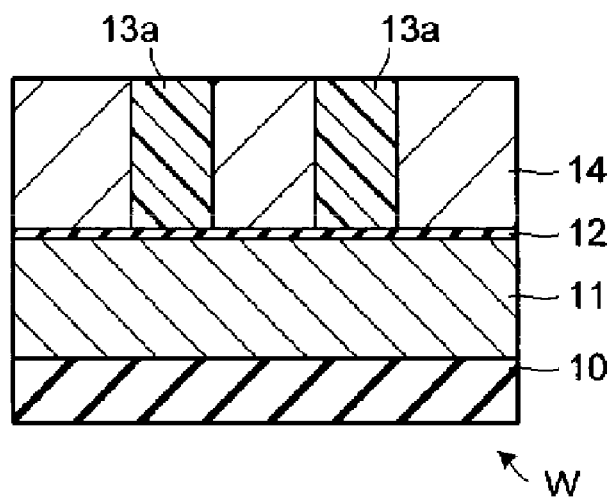

First, as shown in FIG. 1C, during the slimming process, an expansive agent 14 is applied to the photoresist patterns 13a so that gaps between the photoresist patterns 13a are filled with the applied expansive agent 14. Examples of the expansive agent 14 used in this application operation may include a polysilazane-based material (e.g., "Spinfil™" produced by AZ Electronic Materials), a hygroscopic polymer or the like.

Figure 1D:
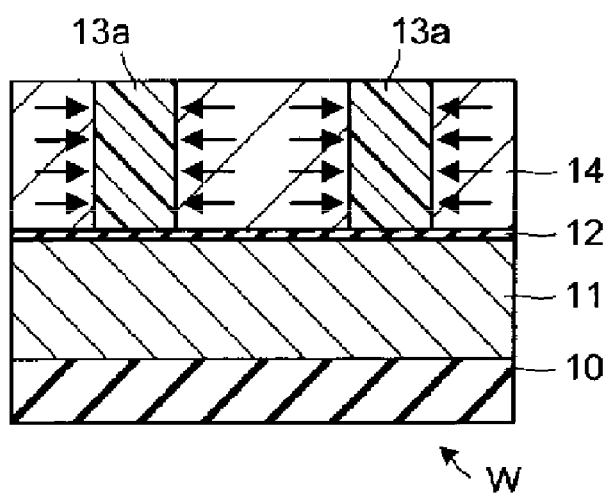

Thereafter, as shown in FIG. 1D, the expansive agent 14 is expanded. In case the expansive agent 14 is made of, e.g., the polysilazane-based material, the expansion of the expansive agent 14 may be performed by applying energy to the expansive agent 14. For example, to expand the expansive agent 14, heat treatment, irradiation, or both may be performed on the expansive agent 14. Alternatively, in case the expansive agent 14 is made of, e.g., the hygroscopic polymer, the expansion may be performed by exposing the expansive agent 14 in an atmosphere having a uniform humidity. When the heat treatment is performed on the expansive agent 14, the lower limit of the heating temperature may be set to be equal to or higher than a boiling point of solvent contained in the expansive agent 14. Specifically, the lower limit may be equal to or higher than 50 degrees C.

Figure 1E:
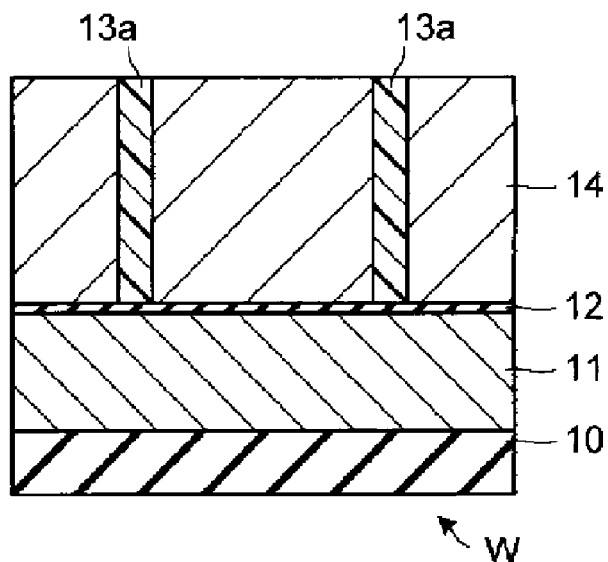

As shown in FIG. 1E, the expansion of the expansive agent 14 due to the slimming process, as stated above, causes the photoresist patterns 13a to be physically pressed in a horizontal direction, so that line widths of the photoresist patterns 13a are slimmed (or narrowed). As a result, the heights of the photoresist patterns 13a are increased compared with those before the slimming process.

Figure 1F:
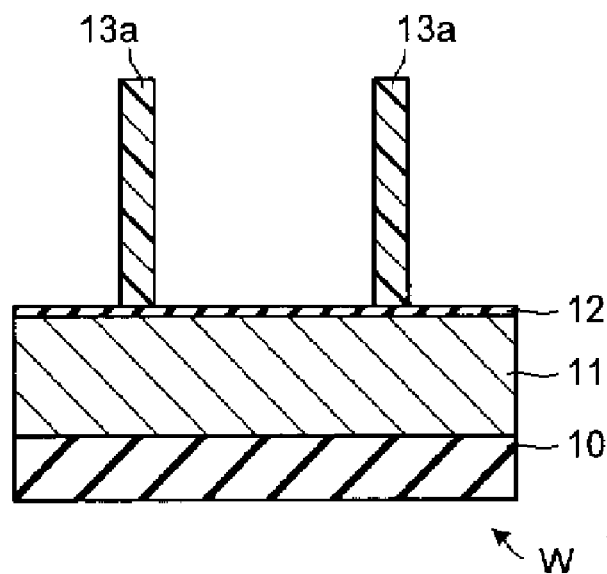

Subsequently, solvent is supplied to the expanded expansive agent 14 so that the expanded expansive agent 14 is dissolved and removed, thereby resulting in a state as shown in FIG. 1F. In some embodiments, examples of the solvent used in the removal step may include an ethyl lactate, PGMEA (Propylene Glycol Monomethyl Ether Acetate), PGME (Propylene Glycol Monomethyl Ether), γ-butyrolactone, cyclohexanone, xylene, pyridine, dimethyl sulfoxide, etc, and a mixed solution of these materials. Specifically, Alcohols may be employed as the solution because this causes little damage to a resist. In such Alcohols, one having 2 to 4 carbon atoms may be employed in terms of solubility, viscosity and the like. In some embodiments, a hydrofluoric acid may be used to remove the expanded expansive agent 14 without being affected by the hardness of the expansive agent 14.

By performing the aforementioned removal process, all sequences of the slimming process are terminated. As such, the above mentioned slimming process makes it possible to slim the photoresist pattern 13a using the physical pressure caused by the expansion of the expansive agent 14, thereby precisely controlling an amount of the resist pattern to be slimmed, regardless of optical conditions and resist species.

Further, such slimming process prevents a decrease in height of the photoresist pattern 13a, which may be caused as a result of the slimming process.

The above process is then followed by additional subsequent processes including the side wall transfer process or the double patterning process. The following is a description on the side wall transfer process.

Figure 2A:
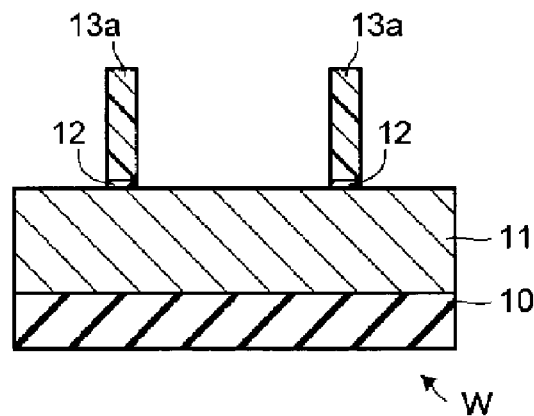
FIGS. 2A to 2D are views illustrating a semiconductor device manufacturing method according to another embodiment of the present disclosure.
Figure 2B:
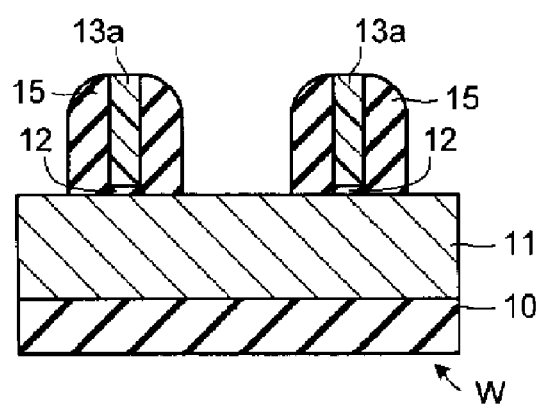

When the side wall transfer process is performed, first, the bottom anti-reflection coating film 12 is removed as shown in FIG. 2A. As shown in FIG. 2B, a mask material layer 15 is then formed such that mask materials are left only in sidewall portions of the photoresist patterns 13a, which has been slimmed by the slimming process. Examples of materials making up the mask material layer 15 may include $SiO_2$ or the like. In case the $SiO_2$ is used, the mask material layer 15 may be formed by depositing a $SiO_2$ film on the photoresist pattern 13a, followed by etching the formed $SiO_2$ film.

In the film-forming step, the $SiO_2$ film is formed on the photoresist pattern 13a. Since a photoresist typically has a susceptibility to high temperatures. That is, the exposure of the photoresist to the high temperatures may cause a collapse of the photoresist. Thus, in some embodiments, a formation of the $SiO_2$ film on the photoresist pattern 13a may be performed at a low temperature (e.g., in the range of 300 degrees C. or less). Further, the formation of the $SiO_2$ film on the photoresist pattern 13a may be performed through a chemical vapor deposition method by which film-forming gas is activated with a heating catalytic substance.

In one embodiment, the etching of the $SiO_2$ film may be performed with a mixture gas of CF-based gases such as $CF_4$, $C_4F_8$, $CHF_3$, $CH_3F$, $C_2F_2$ and Ar gas, or gas that is obtained by adding oxygen to the mixture gas as needed.

Figure 2C:
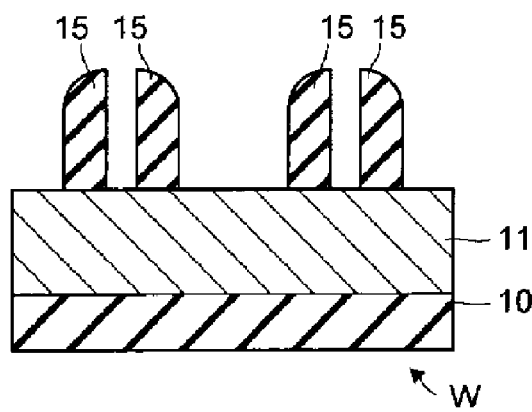

Subsequently, as shown in FIG. 2C, the photoresist pattern 13a and the bottom anti-reflection coating film 12 are removed by, e.g., an ashing process using an oxygen plasma so that a pattern is formed with the mask material layer 15 formed in the sidewalls of the photoresist pattern 13a.

Figure 2D:
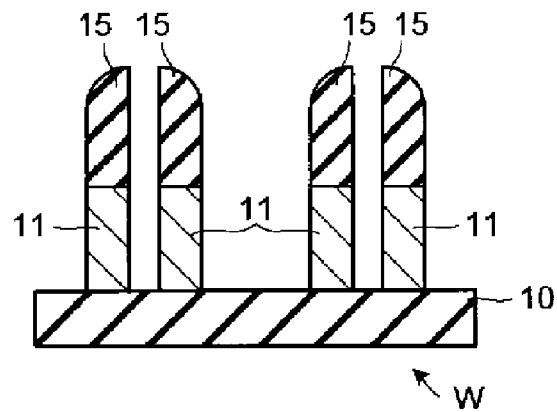

Next, as shown in FIG. 2D, the polysilicon layer 11 as an underlying layer is etched using the pattern of the mask material layer 15 as a mask. In one embodiment, this etching may be performed with, e.g., HBr gas. Through the steps as described above, an isolated line-and-space pattern is formed with a line width narrower than that of the previously formed photoresist pattern 13a while the isolated line-and-space pattern includes twice as many lines as the photoresist patterns 13a.

Figure 3A:
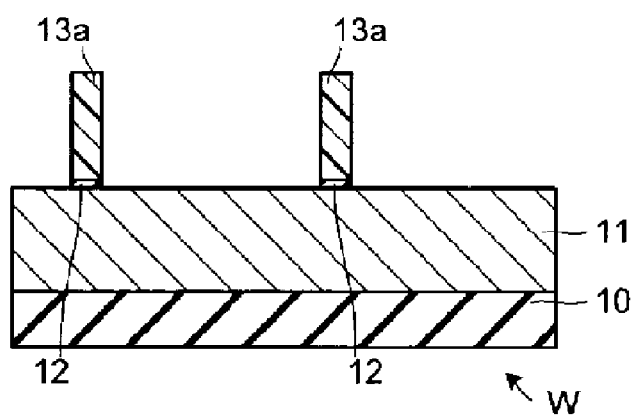
FIGS. 3A to 3H are views illustrating a semiconductor device manufacturing method according to yet another embodiment of the present disclosure.
Figure 3B:
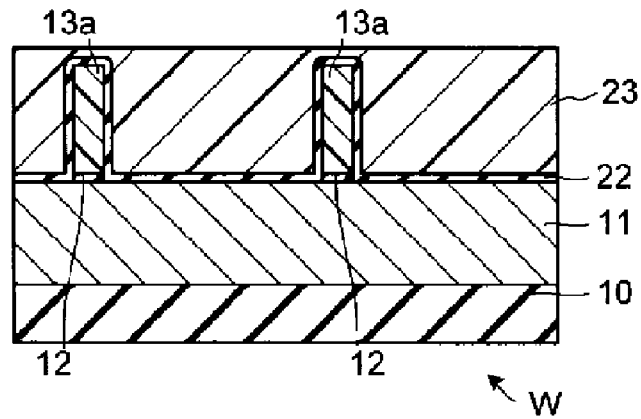

In the following, a description will be made as to the double pattering process. In the double pattering process, the bottom anti-reflection coating film 12 (i.e., a first bottom anti-reflection coating film 12) is removed as shown in FIG. 3A, and then a second bottom anti-reflection coating film 22 is formed on top and side surface of the slimmed photoresist patterns 13a and exposed sidewalls of the first bottom anti-reflection coating films 12 as shown in FIG. 3B. Thereafter, a second photoresist layer 23 is formed on the second bottom anti-reflection coating film 22.

Figure 3C:
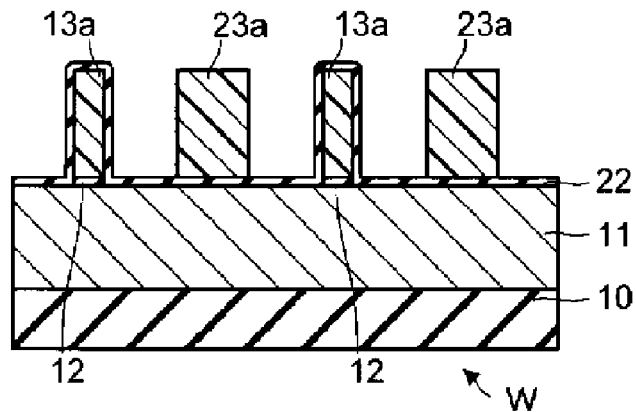

Subsequently, as shown in FIG. 3C, a second resist pattern 23a is formed between two adjacent photoresist patterns 13a (i.e., photoresist patterns 13a) by performing a sequence of exposure and development steps.

Figure 3D:
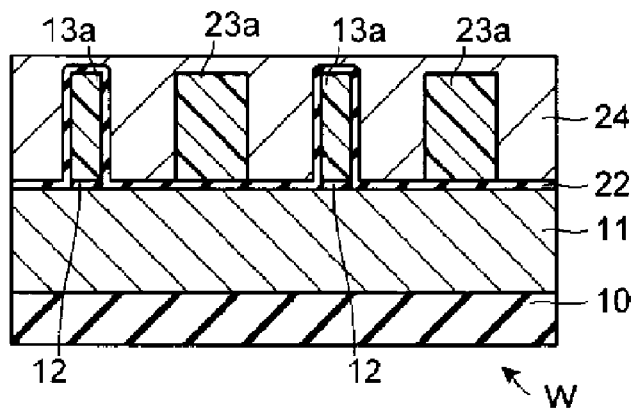

Next, as shown in FIG. 3D, an expansive agent 24 is coated to be filled between the photoresist pattern 13a and the second resist pattern 23a. Examples of the expansive agent 24 used in the coating step may be similar to that used as the expansive agent 14.

Figure 3E:
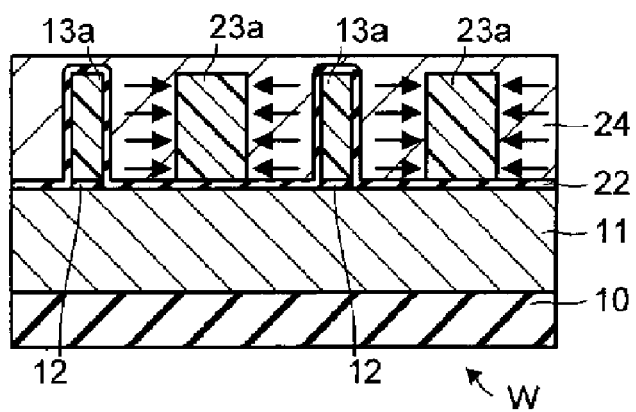

Thereafter, as shown in FIG. 3E, a process of expanding the expansive agent 24 is performed. This expansion may be performed in a manner analogous to that used to the expansive agent 14 as discussed above.

Figure 3F:
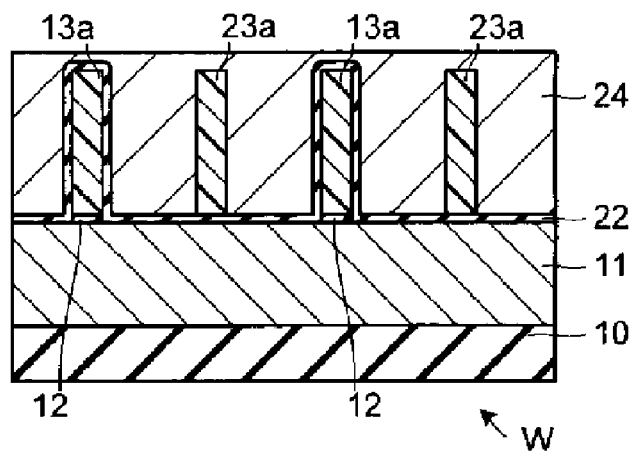

As described above, the expansion causes the second resist pattern 23a to be physically pressed in a horizontal direction, so that line widths second of the resist pattern 23a are slimmed (or narrowed) as shown in FIG. 3F. As such, the height of the second resist pattern 23a is increased as a result of the slimming process.

Figure 3G:
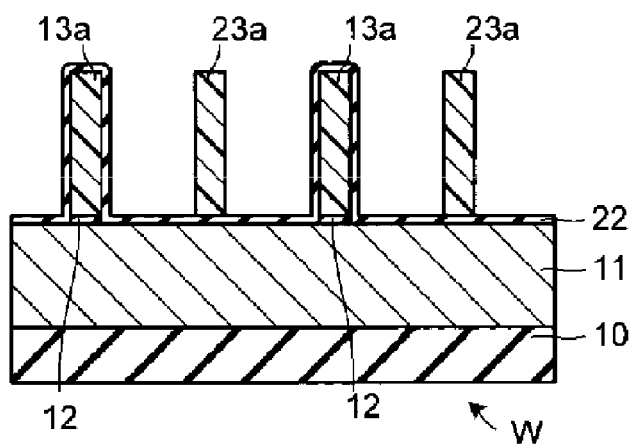

Subsequently, solvent is supplied to the expanded expansive agent 24 so that the expanded expansive agent 24 is dissolved and removed, thereby resulting in a state as shown in FIG. 3G. In some embodiments, the solvent used in this step may be similar to that used in the removal of the expansive agent 14.

By performing the above step of removing the expansive agent 24, the slimming process is completed. As such, the above mentioned slimming process makes it possible to slim the second resist pattern 23a using the physical pressure caused by the expansion of the expansive agent 24, thereby precisely controlling an amount of the second resist pattern 23a to be slimmed, regardless of optical conditions and resist species. Further, a decrease in height of the resist pattern can be prevented, which may be caused by performing the slimming process.

Figure 3H:
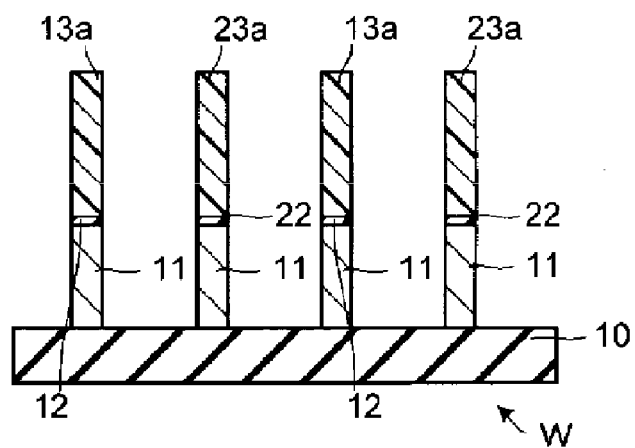

Next, as shown in FIG. 3H, the second bottom anti-reflection coating film 22 is removed, and then the polysilicon layer 11 as an underlying layer is etched using the pattern of the slimmed photoresist patterns 13a and the slimmed second resist pattern 23a as a mask. In one embodiment, this etching may be performed using, e.g., HBr gas. Through the steps as described above, an isolated line-and-space pattern is formed with a line width narrower than that of the previously formed photoresist pattern 13a while the isolated line-and-space pattern includes twice as many lines as the photoresist patterns 13a. Further, in the double patterning process, the expansive agent 14 has been described to be used in the two steps of the slimming process, the present disclosure is not limited thereto. For example, in an alternative embodiment, one of the two steps in the slimming process may use the expansive agent 14 and the other step may use conventional chemicals with which sidewalls of the patterns are solubilized and removed.

Next, a description will be made as to a semiconductor device manufacturing apparatus by which the semiconductor device manufacturing method as described above is implemented.

Figure 4:
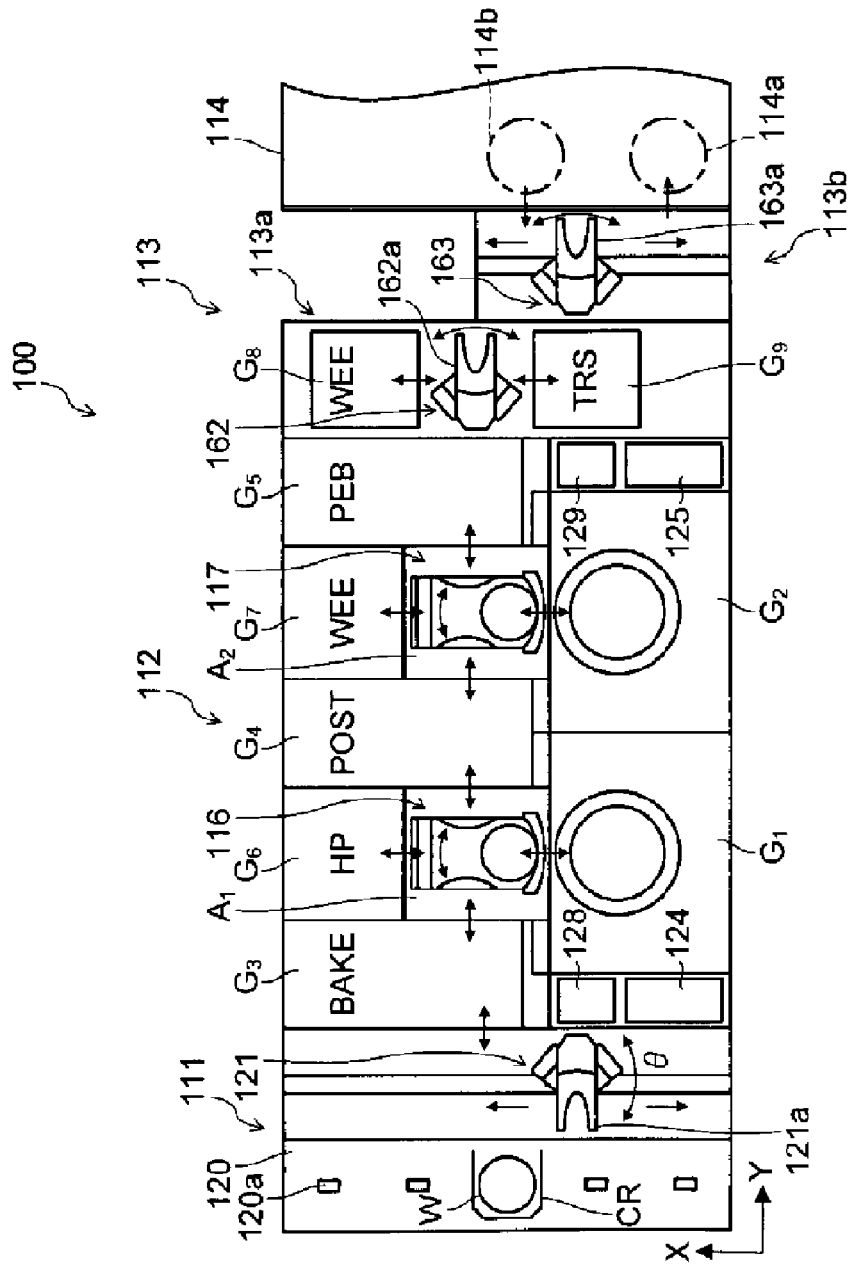
FIG. 4 is a top plan view of a semiconductor device manufacturing apparatus according to still another embodiment of the present disclosure.
Figure 5:
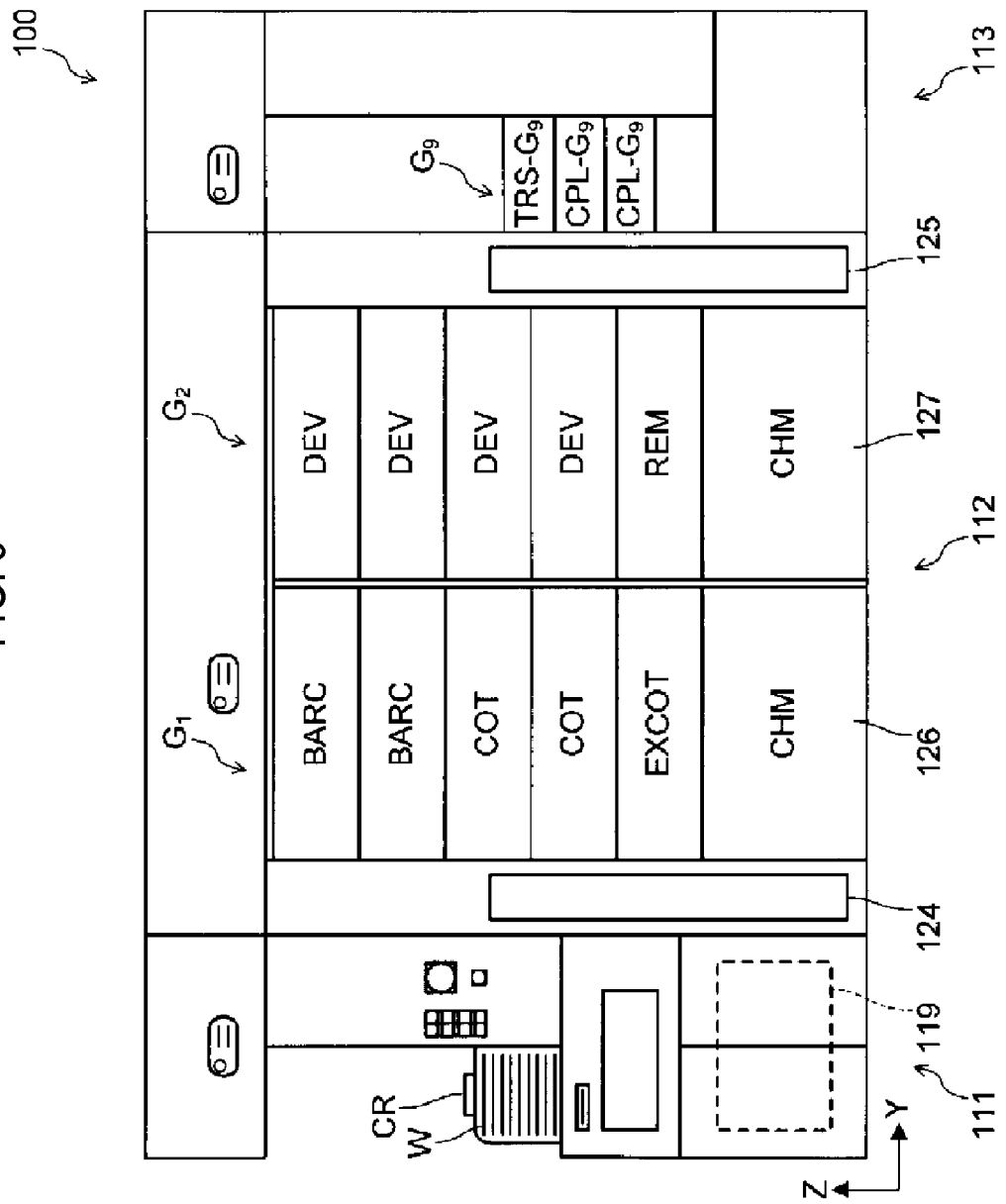
FIG. 5 is a front view of the apparatus shown in FIG. 4.
Figure 6:
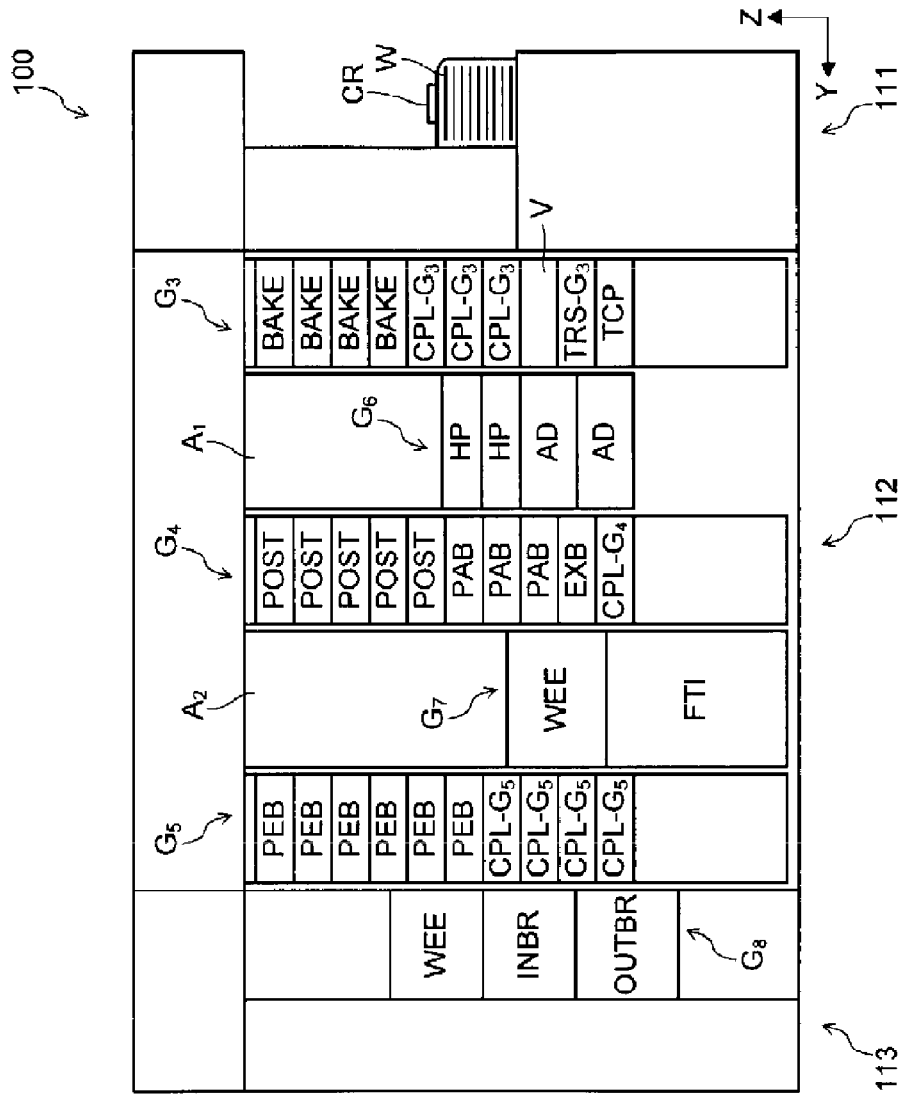
FIG. 6 is a rear view of the apparatus shown in FIG. 4.

FIGS. 4 to 6 are schematic views showing an arrangement of a resist coating/developing system which may be used as a semiconductor device manufacturing apparatus according to one embodiment of the present disclosure. FIGS. 4 to 6 illustrate a plane view, a front view and a rear view of the arrangement, respectively. The resist coating/developing system 100 includes a cassette station 111, a process station 112 having a plurality of processing units, and an interface station 113 configured to deliver semiconductor wafers W between the process station 112 and an exposure apparatus 114 displaced adjacent to the process station 112.

A wafer cassette (CR), which horizontally holds the plurality of the semiconductor wafers W to be processed in the resist coating/developing system 100, is loaded from another system into the cassette station 111. Conversely, a previously loaded wafer cassette (CR), which horizontally also holds semiconductor wafers W previously processed in the resist coating/developing system 100, is carried out of the cassette station 111 to another system. That is, the cassette station 111 is configured to transfer the semiconductor wafers W between the wafer cassette (CR) and the process station 112.

As shown in FIG. 4, a cassette mounting table 120 extending in a X direction is mounted in an end portion of an inlet of the cassette station 111 (in FIG. 4, an end portion of a Y direction). A plurality of (e.g., five in FIG. 4) positioning protrusions 120a is formed on the cassette mounting table 120 in a row along the X direction. The wafer cassette (CR) is disposed at any one of the positioning protrusions 120a with a loading/unloading port of the wafer cassette (CR) oriented towards the process station 112, the semiconductor wafers W being loaded or unloaded through the loading/unloading port.

In the cassette station 111, a wafer transfer mechanism 121 is mounted between the cassette mounting table 120 and the process station 112. The wafer transfer mechanism 121 includes wafer transfer picks 121a, which are movable in a first direction (X direction in FIG. 4) and a second direction (Z direction in FIG. 4). In this case, the wafer cassette (CR) is arranged in the first direction and the semiconductor wafers W of the wafer cassette (CR) are vertically arranged in the second direction. Further, the wafer transfer picks 121a are configured to be rotatable in θ direction as shown in FIG. 4. With this configuration, the wafer transfer picks 121a can access any wafer cassette (CR) and a transition unit (TRS-$G_3$), which is mounted in a third processing unit group G3 (which will be described later) of the process station 112.

In the process station 112, a first processing unit group $G_1$ and a second processing unit group $G_2$ are mounted at the front side of the resist coating/developing system 100 in order from the cassette station 111. Further, the third processing unit group $G_3$, a fourth processing unit group $G_4$ and a fifth processing unit group $G_5$ are mounted at the rear side of the resist coating/developing system 100 in order from the cassette station 111. A first main transfer section $A_1$ is arranged between the third processing unit group $G_3$ and the fourth processing unit group $G_4$. A second main transfer section $A_2$ is arranged between the fourth processing unit group $G_4$ and the fifth processing unit group $G_5$. In addition, a sixth processing unit group $G_6$ is mounted at the rear side of the first main transfer section $A_1$ and a seventh processing unit group $G_7$ is mounted at the rear side of the second main transfer section $A_2$.

As shown in FIGS. 4 and 5, in the first processing unit group $G_1$, five spinner-type processing units used as a solution supply unit are constituted by five stacked units including three coating units (COT) and two coating units (BARC). The two coating units (BARC) are configured to form an anti-reflection film for preventing reflection of light in the exposure process. The five spinner-type processing units are configured to load the semiconductor wafers W on a spin chuck in a cup and perform a predetermined process on the loaded semiconductor wafers W. In one embodiment, among the three coating units, one is an expansive agent coating unit (EXCOT) for coating an expansive agent 14 in the slimming process as described above, and the other two may be resist coating units (COT) for coating a photoresist on the loaded semiconductor wafers W. In the second processing unit group $G_2$, the five spinner-type processing units are constituted by five stacked units including an expansive agent removing unit (REM) for removing the expansive agent used in the slimming process as described above, and four developing units (DEV).

As shown in FIG. 6, a temperature adjusting unit (TCP), a transition unit (TRS-$G_3$) and a spare space V are mounted in the third processing unit group $G_3$. The transition unit (TRS-$G_3$) is used as a transfer section for transferring the semiconductor wafers W between the cassette station 111 and the first main transfer section $A_1$, and the spare space V is used to further mount a desired oven-type processing unit or the like. On the top of the above units, three high-precision temperature adjusting units (CPL-$G_3$), which is configured to conduct heat treatment to the loaded semiconductor wafers W under temperature controlled with a high precision, and four high-temperature heat treating units (BAKE), which is configured to conduct a predetermined heat treatment to the loaded semiconductor wafers W, are stacked to form a total of ten stages in order from the bottom in the third processing unit group $G_3$.

A high-precision temperature adjusting unit (CPL-$G_4$), an expansion heating unit (EXB) and three pre-bake units (PAB) are mounted in the fourth processing unit group $G_4$. The expansion heating unit (EXB) is configured to expand the expansive agent used in the slimming process as described above, and three pre-bake units (PAB) are configured to conduct heat treatment to the semiconductor wafers W, on which a resist is coated. On the top of the above units, five post-bake units (POST) for conducting heat treatment to the semiconductor wafers W, which have been subjected to a development, are stacked to form a total of ten stages in order from the bottom in the fourth processing unit group $G_4$.

Further, four high-precision temperature adjusting units (CPL-$G_5$), and six post-exposure bake units (PEB) are mounted in the fifth processing unit group $G_5$. Four high-precision temperature adjusting units (CPL-$G_5$), and six post-exposure bake units (PEB) for conducting heat treatment to the semiconductor wafers W after exposure and before development, are stacked to form a total of ten stages in order from the bottom.

[For example, the high-temperature heat treating units (BAKE), the pre-bake units (PAB), the post-bake units (POST) and the post-exposure bake units (PEB), which are mounted in the third to fifth processing unit groups $G_3$ to $G_5$, have the same configuration constituting a heat treating unit. Further, in addition to the heating units, a light irradiation mechanism for irradiating light (e.g., ultraviolet) to the semiconductor wafers W is installed in the expansion heating unit (EXB) mounted in the fourth processing unit group $G_4$.

Although the specific number of stacked stages and the specific arrangement of respective units in the third to fifth processing unit groups $G_3$ to $G_5$ have been described with reference to FIG. 6, it is not limited thereto. Alternatively, the number of stacked stages and the arrangement of the respective units may be modified in any other suitable manner.

Mounted in the sixth processing unit group $G_6$ are two adhesion units (AD), and two heating units (HP) for heating the semiconductor wafers W, which are stacked to form a total of four stages in order from the bottom.

Mounted in the seventh processing unit group $G_7$ are a film thickness measuring device (FTI) for measuring the thickness of a resist film, and a peripheral exposure device (WEE) for selectively exposing only edge portions of the semiconductor wafers W to light, which are stacked to form a total of two stages in order from the bottom.

As shown in FIG. 4, a first main wafer transfer device 116 is mounted in the first main transfer section $A_1$. The first main wafer transfer device 116 is configured to be selectively accessible to respective units installed in the first processing unit group $G_1$, the third processing unit group $G_3$, the fourth processing unit group $G_4$ and the sixth processing unit group $G_6$.

Similarly, a second main wafer transfer device 117 is mounted in the second main transfer section $A_2$. The second main wafer transfer device 117 is configured to be selectively accessible to respective units installed in the second processing unit group $G_2$, the fourth processing unit group $G_4$, the fifth processing unit group $G_5$ and the seventh processing unit group $G_7$.

Three vertically-stacked arms for holding the semiconductor wafers W are installed in each of the first and second main wafer transfer devices 116 and 117. This configuration allows the semiconductor wafers W to be held by the arms, thereby transferring them in any of X, Y, Z and θ directions.

As shown in FIG. 4, a liquid temperature adjusting pump 124 and a duct 128 are installed between the first processing unit group $G_1$ and the cassette station 111. A liquid temperature adjusting pump 125 and a duct 129 are installed between the second processing unit group $G_2$ and the interface station 113. The liquid temperature adjusting pumps 124 and 125 are configured to supply a predetermined processing solution to the first processing unit group $G_1$ and the second processing unit group $G_2$, respectively. The ducts 128 and 129 are configured to supply clean air to the inside of the first to fifth processing unit groups $G_1$ to $G_5$, the clean air being supplied from a conditioner installed outside the resist coating/developing system 100.

Each of the first to seventh processing unit groups $G_1$ to $G_7$ is configured to be detachable from the resist coating/developing system 100 for maintenance purposes. Further, a panel mounted in the rear side of the process station 112 is configured to be detachable and openable therefrom. As shown in FIG. 5, chemical units (CHM) 126 and 127, each of which is configured to supply a predetermined processing solution to the first and second processing unit groups $G_1$ and $G_2$, are installed in the bottom portion of the first and second processing unit groups $G_1$ and $G_2$.

The interface station 113 includes a first interface station 113a positioned at the side of the process station 112 and a second interface station 113b positioned at the side of the exposure apparatus 114. A first wafer transfer part 162 is installed to face an opening of the fifth processing unit group $G_5$ in the first interface station 113a. A second wafer transfer part 163 is installed to be movable in X direction in the second interface station 113b.

As shown in FIG. 6, an eighth processing unit group $G_8$ is mounted in the rear side of the first wafer transfer part 162 The eighth processing unit group $G_8$ includes an outer buffer cassette (OUTER) configured to temporarily hold therein the semiconductor wafers W carried out of the exposure apparatus 114, an inner buffer cassette (INBR) configured to temporarily hold therein the semiconductor wafers W to be carried in the exposure apparatus 114, and a peripheral exposure device (WEE), which are stacked in order from the bottom. In some embodiments, the outer buffer cassette (OUTER) and the inner buffer cassette (INBR) may be configured to hold a plurality of (e.g., 25) semiconductor wafers W therein.

In addition, as shown in FIG. 5, a ninth processing unit group $G_9$ is mounted in the front side of the first wafer transfer part 162. The ninth processing unit group $G_9$ is constituted by stacking two high-precision temperature adjusting units (CPL-$G_9$) and a transition unit (TRS-$G_9$) in order from the bottom.

As shown in FIG. 4, the first wafer transfer part 162 is movable in Z direction and rotatable in θ direction, which further includes a wafer transfer fork 162a configured to be displaceable on the X-Y plane. The wafer transfer fork 162a is configured to be selectively accessible to respective units of the fifth processing unit group $G_5$, the eighth processing unit group $G_8$ and the ninth processing unit group $G_9$. This allows the semiconductor wafers W to be transferred between the respective units.

Similarly, the second wafer transfer part 163 is movable in both X and Z directions and is rotatable in θ direction, which further includes a wafer transfer fork 163a configured to be displaceable on the X-Y plane. The wafer transfer fork 163a is configured to be selectively accessible to respective units of the ninth processing unit group G9, and an in-stage 114a and an out-stage 114b of the exposure apparatus 114. This enables the semiconductor wafers W to be transferred between the respective units (and/or respective arts).

As shown in FIG. 5, a central control unit 119 configured to control the entire operation of the resist coating/developing system 100 is installed in the lower portion of the cassette station 111. The central control unit 119 includes a process controller having a central processing unit (CPU) configured to control respective units of the resist coating/developing system 100 and respective structural parts of each transfer mechanism, an user interface such as a keyboard, a display or the like, and a memory unit in which control programs, recipes, various kinds of databases or the like are stored.

With the use of the resist coating/developing system 100 with the configuration as described above, the above-described slimming process for the resist pattern is performed as follows.

First, the wafer transfer mechanism 121 unloads an unprocessed semiconductor wafer W from the wafer cassette (CR) one by one, and transfers the unloaded wafer to the transition unit (TRS-$G_3$) mounted in the third processing unit group $G_3$ of the process station 112.

Subsequently, a temperature adjustment in the temperature adjusting unit (TCP) is performed on the transferred semiconductor wafer W, and then an anti-reflection film is coated on that semiconductor wafer W in the bottom anti-reflection coating unit (BARC) of the first processing unit group $G_1$. Thereafter, heat treatment in the heating unit (HP) and subsequent bake-treatment in the high-temperature heat treating unit (BAKE) are performed on the wafer W with the anti-reflection film coated thereon. In one embodiment, an adhesion process may be performed on the semiconductor wafer W by the adhesion unit (AD) before the anti-reflection film is formed on the semiconductor wafer W by the bottom anti-reflection coating (BARC).

Thereafter, a temperature adjustment in the high-precision temperature adjusting unit (CPL-$G_4$) is further performed on the semiconductor wafer W. Subsequently, the semiconductor wafer W is transferred to the resist coating unit (COT) of the first processing unit group $G_1$ where a resist solution is applied on the semiconductor wafer W.

Then, the semiconductor wafer W is carried in the pre-bake unit (PAB) of the fourth processing unit group $G_4$, where pre-bake treatment is performed on the semiconductor wafer W. Thereafter, exposure treatment in the peripheral exposure device (WEE) and a subsequent temperature adjustment in the high-precision temperature adjusting unit (CPL-$G_9$) are performed on the periphery of the semiconductor wafer W. The semiconductor wafer W is then carried in the exposure apparatus 114 by the second wafer transfer part 163.

The semiconductor wafers W subjected to the exposure process in the exposure apparatus 114 is carried in the transition unit (TRS-$G_9$) by the second wafer transfer part 163. Thereafter, the semiconductor wafer W is subjected to a sequence of processes, including a post-exposure bake process in post-exposure bake units (PEB) of the fifth processing unit group $G_5$, a development process in the developing unit (DEV) of the second processing unit group $G_2$, a post-bake process in the post-bake unit (POST), and a temperature adjustment in the high-precision temperature adjusting unit (CPL-$G_3$).

According to the sequence of processes as described above, the pattering for the resist pattern is performed. The slimming process is then performed to slim the resist pattern formed by the patterning process.

In the slimming process, first, an expansive agent is coated on the semiconductor wafer W by the expansive agent coating unit (EXCOT) of the first processing unit group $G_1$. In some embodiments, the coating of the expansive agent on the semiconductor wafer W may be performed by a spin coating process for feeding the expansive agent onto the surface of the semiconductor wafer W, and rotating the semiconductor wafer W to spread the expansive agent by virtue of a centrifugal force caused by the rotation.

The semiconductor wafer W with the expansive agent coated thereon is carried in the expansion heating unit (EXB) of the fourth processing unit group $G_4$, where the semiconductor wafer W is subjected to heat and light (e.g., ultraviolet) irradiation, thereby allowing the expansive agent to expand. When a hygroscopic polymer is employed as the expansive agent, there is a need to use an expansive agent expanding unit, which is configured to form an atmosphere of a uniform temperature as described above and supply water to the expansive agent so that the expansive agent is expanded.

Subsequently, the semiconductor wafer W is carried in the expansive agent removing unit (REM) of the second processing unit group $G_2$, where the expanded expansive agent is removed. Various kinds of solutions as described above may be used to remove the expanded expansive agent.

After the slimming process for the resist pattern is performed in the manner as described above, the side wall transfer process may be performed by forming a mask layer on side walls of the resist pattern, or the double patterning process may be performed by formation of a second resist pattern, as needed.

Further, when a polysilazane-based material is employed as the expansive agent, the polysilazane-based material is hydrolyzed to cause ammonia gas. For this reason, the removal process for a system using lithography may require a method (e.g., regulating air flow, installing additional arms, etc) for preventing amine gas from being introduced into a coating/heating module. On the other hand, when the removal process is performed using a separate system without using lithography, a specific configuration as described above is not required.

According to the above embodiments, it is possible to precisely control an amount to be slimmed irrespective of optical conditions and resist species, and prevent a decrease in height of resist, which may be caused by the slimming process.

While certain embodiments have been described, these embodiments have been presented by way of example only, and are not intended to limit the scope of the disclosures. Indeed, the novel methods and apparatuses described herein may be embodied in a variety of other forms; furthermore, various omissions, substitutions and changes in the form of the embodiments described herein may be made without departing from the spirit of the disclosures. The various embodiments are not necessarily mutually exclusive as aspects of one embodiment can be combined with aspects of another embodiment. The accompanying claims and their equivalents are intended to cover such forms or modifications as would fall within the scope and spirit of the disclosures.

What is claimed is:

1. A method of manufacturing a semiconductor device, the method comprising:

forming a resist layer on a substrate;

performing an exposure and development processes on the resist layer to form a resist pattern;
performing a slimming process to slim the resist pattern;
forming a mask material layer on side walls of the slimmed resist pattern; and
removing the slimmed resist pattern,
wherein the slimming process includes:
coating an expansive agent on the substrate;
expanding the expansive agent such that the resist pattern is physically pressed in a horizontal direction; and
removing the expanded expansive agent.

2. A method of manufacturing a semiconductor device, the method comprising:
forming a first resist layer on a substrate;
performing an exposure and development processes on the first resist layer to form a first resist pattern;
performing a first slimming process to slim the first resist pattern;
forming a second resist layer on the substrate;
performing the exposure and development process on the second resist layer to form a second resist pattern; and
performing a second slimming process to slim the second resist pattern,
wherein at least one of the first and second slimming processes includes:
coating an expansive agent on the substrate;
expanding the expansive agent such that the resist pattern is physically pressed in a horizontal direction; and
removing the expanded expansive agent.

3. A method of manufacturing a semiconductor device, the method comprising:
forming a resist layer on a substrate;
performing an exposure and development processes on the resist layer to form a resist pattern; and
performing a slimming process to slim the resist pattern,
wherein the slimming process includes:
coating an expansive agent on the substrate;
expanding the expansive agent such that the resist pattern is physically pressed in a horizontal direction; and
removing the expanded expansive agent.

4. The method of claim 1, wherein expanding the expansive agent comprises at least one of heating the expansive agent and irradiating light to the expansive agent.

* * * * *